US009787327B2

(12) United States Patent
Zhang et al.

(10) Patent No.: US 9,787,327 B2
(45) Date of Patent: Oct. 10, 2017

(54) LOW-POWER PARTIAL-PARALLEL CHIEN SEARCH ARCHITECTURE WITH POLYNOMIAL DEGREE REDUCTION

(71) Applicant: SANDISK TECHNOLOGIES INC., Plano, TX (US)

(72) Inventors: Xinmiao Zhang, Seattle, WA (US); Itai Dror, Omer (IL)

(73) Assignee: SANDISK TECHNOLOGIES LLC, Plano, TX (US)

( * ) Notice: Subject to any disclaimer, the term of this patent is extended or adjusted under 35 U.S.C. 154(b) by 226 days.

(21) Appl. No.: 14/706,767

(22) Filed: May 7, 2015

(65) Prior Publication Data
US 2016/0329911 A1    Nov. 10, 2016

(51) Int. Cl.
H03M 13/15 (2006.01)
H03M 13/00 (2006.01)
G06F 11/10 (2006.01)

(52) U.S. Cl.
CPC ....... H03M 13/1545 (2013.01); G06F 11/108 (2013.01); G06F 11/1076 (2013.01); H03M 13/157 (2013.01); H03M 13/1515 (2013.01); H03M 13/1525 (2013.01); H03M 13/617 (2013.01); H03M 13/6561 (2013.01); *H03M 13/152* (2013.01)

(58) Field of Classification Search
CPC ........... H03M 13/157; H03M 13/1545; H03M 13/6561; H03M 13/152; H03M 13/1515; H03M 13/1525; H03M 13/617; G06F 11/1076; G06F 11/108

USPC ....... 714/781, 782, 784, 785, 752, 799, 763, 714/773
See application file for complete search history.

(56) References Cited

U.S. PATENT DOCUMENTS

| 6,154,868 | A  | * | 11/2000 | Cox         | H03M 13/1515 714/784 |
| 6,192,497 | B1 | * | 2/2001  | Yang        | H03M 13/1515 714/781 |
| 6,279,137 | B1 | * | 8/2001  | Poeppelman  | H03M 13/1515 714/781 |
| 6,990,624 | B2 | * | 1/2006  | Dohmen      | H03M 13/1595 714/782 |

(Continued)

OTHER PUBLICATIONS

Yoo, H. et al. "Low-Complexity Parallel Chien Search Structure Using Two-Dimensional Optimization," IEEE Transactions on Circuits and Systems—II: Express Briefs, vol. 58, No. 8, Aug. 2011, pp. 522-526.

(Continued)

*Primary Examiner* — John J Tabone, Jr.
(74) *Attorney, Agent, or Firm* — Toler Law Group, PC

(57) ABSTRACT

A device includes a controller, and the controller includes a root detection circuit having multiple sets of multipliers. A method includes configuring the root detection circuit according to a degree of a polynomial. In response to detection of a root of multiple roots of the polynomial, a configuration of the root detection circuit is modified based on a polynomial degree reduction (PDR) scheme. Depending on the particular implementation, the device may be implemented in a data storage device, a communication system (e.g., a wireless communication device or a wired communication device), or another electronic device.

24 Claims, 9 Drawing Sheets

(56) References Cited

U.S. PATENT DOCUMENTS

| | | | | |
|---|---|---|---|---|
| 7,716,562 B1* | 5/2010 | Wu | ............... | H03M 13/1515 |
| | | | | 714/784 |
| 8,276,051 B2* | 9/2012 | Weingarten | ....... | H03M 13/1515 |
| | | | | 714/781 |
| 8,327,242 B1* | 12/2012 | Anholt | ............. | H03M 13/1525 |
| | | | | 714/785 |
| 9,455,747 B1* | 9/2016 | Lin | ............... | H03M 13/1575 |
| 2003/0101406 A1* | 5/2003 | Song | ................... | H03M 13/00 |
| | | | | 714/774 |

OTHER PUBLICATIONS

Wong, S.-Y. et al. "Low Power Chien Search for BCH Decoder Using RT-Level Power Management," IEEE Transactions on Very Large Scale Integration (VLSI) Systems, vol. 19, No. 2, Feb. 2011, pp. 338-341.

Chen, Y. et al. "Small Area Parallel Chien Search Architectures for Long BCH Codes," IEEE Transactions on Very Large Scale Integration (VLSI) Systems, vol. 12, No. 5, May 2004, pp. 545-549.

Cho, J. et al. "Strength-Reduced Parallel Chien Search Architecture for Strong BCH Codes," IEEE Transactions on Circuits and Systems—II: Express Briefs, vol. 55, No. 5, May 2008, pp. 427-431.

Zhang, X. et al. "A Low-Complexity Three-Error-Correcting BCH Decoder for Optical Transport Network," IEEE Transactions on Circuits & Systems—II: Express Briefs, vol. 59, No. 10, Oct. 2012, pp. 663-667.

\* cited by examiner

US 9,787,327 B2

LOW-POWER PARTIAL-PARALLEL CHIEN SEARCH ARCHITECTURE WITH POLYNOMIAL DEGREE REDUCTION

FIELD OF THE DISCLOSURE

This disclosure is generally related to electronic devices and more particularly to error correction processes for electronic devices.

BACKGROUND

Non-volatile storage devices have enabled increased portability of data and software applications. Non-volatile storage devices can enhance data storage density by storing multiple bits in each memory cell. For example, multi-level cell (MLC) flash memory devices provide increased storage density by storing 2 bits per cell, 3 bits per cell, 4 bits per cell, or more. Although increasing the number of bits per cell and reducing device feature dimensions may increase the storage density of a memory device, an error rate of data stored at the memory device may also increase.

Error correction coding (ECC) is often used to correct errors that occur in data read from a memory device. Prior to storage, data may be encoded by an ECC encoder to generate redundant information that may be stored with the data as an ECC codeword. Examples of ECC techniques include Bose-Chaudhuri-Hocquenghem (BCH) and Reed-Solomon techniques.

After retrieving the data, a decoding process may be performed using the redundant information to correct one or more errors that may have occurred during writing, storage, or reading of the data. The decoding process may include a Chien search to determine roots of polynomials over a finite field. The Chien search in BCH and Reed-Solomon decoding accounts for a significant part of the overall decoder power consumption, especially for long codes constructed over finite fields of high order.

DETAILED DESCRIPTION

Figure 1A:
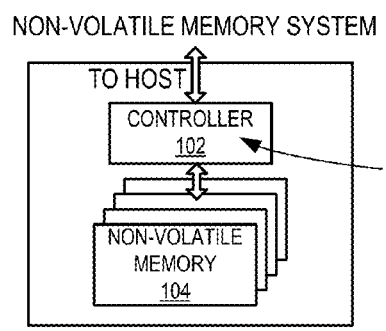
FIG. 1A is a block diagram of an illustrative example of a non-volatile memory system including a controller that includes a polynomial degree reduction (PDR)-based partial-parallel Chien search circuit.

A decoder is configured to operate in accordance with a low-power partial-parallel Chien search that uses a polynomial degree reduction (PDR) scheme. For example, by analyzing the formulas of the evaluation value computation over finite field elements and the intermediate results that are available during the Chien search process, a partial-parallel Chien search process is disclosed that decodes data using less power as compared to other Chien search circuits, such as circuits that implement a partial-parallel Chien search without use of a PDR scheme. The polynomial degree is reduced (e.g., on-the-fly) by one every time a root is found, and accordingly the corresponding hardware units can be turned off. Additionally, the polynomial degree reduction may be achieved by using existing intermediate results, and hence the latency and area overhead is reduced. The power saving enabled by the disclosure may be more significant for BCH codes with higher error-correcting capability. In an illustrative, non-limiting implementation, a 122-error-correcting Bose-Chaudhuri-Hocquenghem (BCH) code over $GF(2^{15})$, an 8-parallel Chien search using the proposed architecture achieves 32% power reduction over existing partial-parallel architectures.

Some serial Chien search circuits use a polynomial degree reduction (PDR) scheme. In this case, the error locator polynomial degree is reduced by one every time a root is found, and hence the hardware units associated with the higher coefficients can be turned off. The PDR scheme may reduce device power consumption (e.g., as compared to schemes that share intermediate results to implement the constant multipliers used in the Chien search). However, the PDR scheme cannot be directly extended for partial-parallel Chien search, which may be used in systems to achieve high speed. In accordance with the disclosure, low power consumption and high decoding performance efficiency may be enabled by using a PDR scheme in connection with a partial-parallel Chien search architecture.

Particular aspects of the present disclosure are described below with reference to the drawings. In the description, common features are designated by common reference numbers. Although certain examples are described herein with reference to a data storage device, it should be appreciated that techniques described herein are applicable to other implementations. For example, information can be received by a communication device (e.g., wirelessly or from a wired network) alternatively or in addition to accessing information from a memory. Error correction coding (ECC) techniques may be utilized to improve reliability of communications (wired or wireless). Further, it is to be appreciated that certain ordinal terms (e.g., "first" or "second") may be provided for ease of reference and do not necessarily imply physical characteristics or ordering. Therefore, as used herein, an ordinal term (e.g., "first," "second," "third," etc.) used to modify an element, such as a structure, a component, an operation, etc., does not necessarily indicate priority or order of the element with respect to another element, but rather distinguishes the element from another element having a same name (but for use of the ordinal term). In addition, as used herein, indefinite articles ("a" and "an") may indicate "one or more" rather than "one." As used herein, a structure or operation that "comprises" or "includes" an element may include one or more other elements not explicitly recited. Further, an operation performed "based on" a condition or event may also be performed based on one or more other conditions or events not explicitly recited. As used herein, "examplary" may indicate an example, an implementation, and/or an aspect, and should not be construed as limiting or as indicating a preference or a preferred example, implementation, and/or aspect.

Figure 1B:
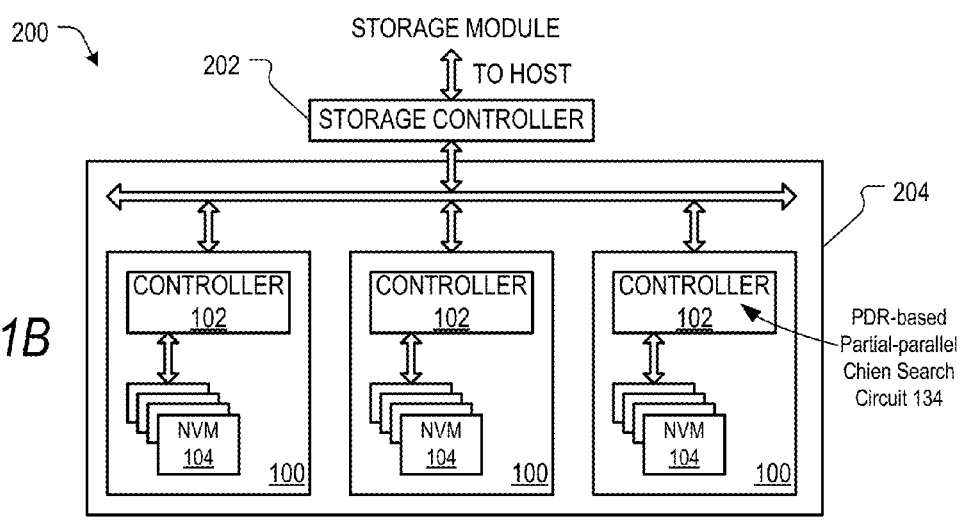
FIG. 1B is a block diagram of an illustrative example of a storage module that includes plural non-volatile memory systems that each may include a controller having a PDR-based partial-parallel Chien search circuit.
Figure 1C:
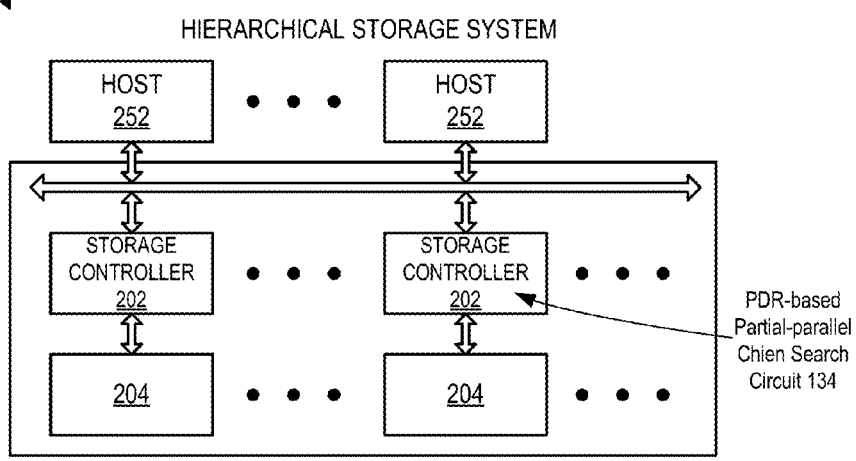
FIG. 1C is a block diagram of an illustrative example of a hierarchical storage system that includes a plurality of storage controllers that each may include a PDR-based partial-parallel Chien search circuit.

Memory systems suitable for use in implementing aspects of the disclosure are shown in FIGS. 1A-1C. FIG. 1A is a block diagram illustrating a non-volatile memory system according to an embodiment of the subject matter described herein. Referring to FIG. 1A, a non-volatile memory system 100 includes a controller 102 and non-volatile memory that may be made up of one or more non-volatile memory die 104. As used herein, the term "memory die" refers to the collection of non-volatile memory cells, and associated circuitry for managing the physical operation of those non-volatile memory cells, that are formed on a single semiconductor substrate. Controller 102 interfaces with a host system and transmits command sequences for read, program, and erase operations to non-volatile memory die 104. The controller 102 may include a polynomial degree reduction (PDR)-based partial-parallel Chien search circuit 134. An illustrative implementation of the PDR-based partial-parallel Chien search circuit 134 is described further with reference to FIG. 3.

The controller 102 (which may be a flash memory controller) can take the form of processing circuitry, a microprocessor or processor, and a computer-readable medium that stores computer-readable program code (e.g., firmware) executable by the (micro)processor, logic gates, switches, an application specific integrated circuit (ASIC), a programmable logic controller, and an embedded microcontroller, for example. The controller 102 can be configured with hardware and/or firmware to perform the various functions described below and shown in the flow diagrams. Also, some of the components shown as being internal to the controller can be stored external to the controller, and other components can be used. Additionally, the phrase "operatively in communication with" could mean directly in communication with or indirectly (wired or wireless) in communication with through one or more components, which may or may not be shown or described herein.

As used herein, a flash memory controller is a device that manages data stored on flash memory and communicates with a host, such as a computer or electronic device. A flash memory controller can have various functionality in addition to the specific functionality described herein. For example, the flash memory controller can format the flash memory to ensure the memory is operating properly, map out bad flash memory cells, and allocate spare cells to be substituted for future failed cells. Some part of the spare cells can be used to hold firmware to operate the flash memory controller and implement other features. In operation, a host communicates with the flash memory controller to read data from or write data to the flash memory. If the host provides a logical address to which data is to be read/written, the flash memory controller can convert the logical address received from the host to a physical address in the flash memory. (Alternatively, the host can provide the physical address.) The flash memory controller can also perform various memory management functions, such as, but not limited to, wear leveling (distributing writes to avoid wearing out specific blocks of memory that would otherwise be repeatedly written to) and garbage collection (after a block is full, moving only the valid pages of data to a new block, so the full block can be erased and reused).

Non-volatile memory die 104 may include any suitable non-volatile storage medium, including NAND flash memory cells and/or NOR flash memory cells. The memory cells can take the form of solid-state (e.g., flash) memory cells and can be one-time programmable, few-time programmable, or many-time programmable. The memory cells can also be single-level cells (SLC), multiple-level cells (MLC), triple-level cells (TLC), or use other memory cell level technologies, now known or later developed. Also, the memory cells can be fabricated in a two-dimensional or three-dimensional fashion.

The interface between controller 102 and non-volatile memory die 104 may be any suitable flash interface, such as Toggle Mode 200, 400, or 800. In one embodiment, non-volatile memory system 100 may be a card based system, such as a secure digital (SD) or a micro secure digital (micro-SD) card. In an alternate embodiment, memory system 100 may be part of an embedded memory system.

Although, in the example illustrated in FIG. 1A, non-volatile memory system 100 (sometimes referred to herein as a storage module) includes a single channel between controller 102 and non-volatile memory die 104, the subject matter described herein is not limited to having a single memory channel. For example, in some NAND memory system architectures (such as the ones shown in FIGS. 1B and 1C), 2, 4, 8 or more NAND channels may exist between the controller and the NAND memory device, depending on controller capabilities. In any of the embodiments described herein, more than a single channel may exist between the controller 102 and the non-volatile memory die 104, even if a single channel is shown in the drawings.

FIG. 1B illustrates a storage module 200 that includes plural non-volatile memory systems 100. As such, storage module 200 may include a storage controller 202 that interfaces with a host and with storage system 204, which includes a plurality of non-volatile memory systems 100. The interface between storage controller 202 and non-volatile memory systems 100 may be a bus interface, such as a serial advanced technology attachment (SATA) or peripheral component interface express (PCIe) interface. Storage module 200, in one embodiment, may be a solid state drive (SSD), such as found in portable computing devices, such as laptop computers, and tablet computers. Each controller 102 of FIG. 1B may include a PDR-based partial-parallel Chien search circuit corresponding to the PDR-based partial-parallel Chien search circuit 134. Alternatively or in addition, the storage controller 202 may include a PDR-based partial-parallel Chien search circuit corresponding to the PDR-based partial-parallel Chien search circuit 134.

FIG. 1C is a block diagram illustrating a hierarchical storage system. A hierarchical storage system 250 includes a plurality of storage controllers 202, each of which controls a respective storage system 204. Host systems 252 may access memories within the hierarchical storage system 250 via a bus interface. In one embodiment, the bus interface may be an NVMe or fiber channel over Ethernet (FCoE) interface. In one embodiment, the hierarchical storage system 250 illustrated in FIG. 1C may be a rack mountable mass storage system that is accessible by multiple host computers, such as would be found in a data center or other location where mass storage is needed. Each storage controller 202 of FIG. 1B may include a PDR-based partial-parallel Chien search circuit corresponding to the PDR-based partial-parallel Chien search circuit 134.

Figure 2A:
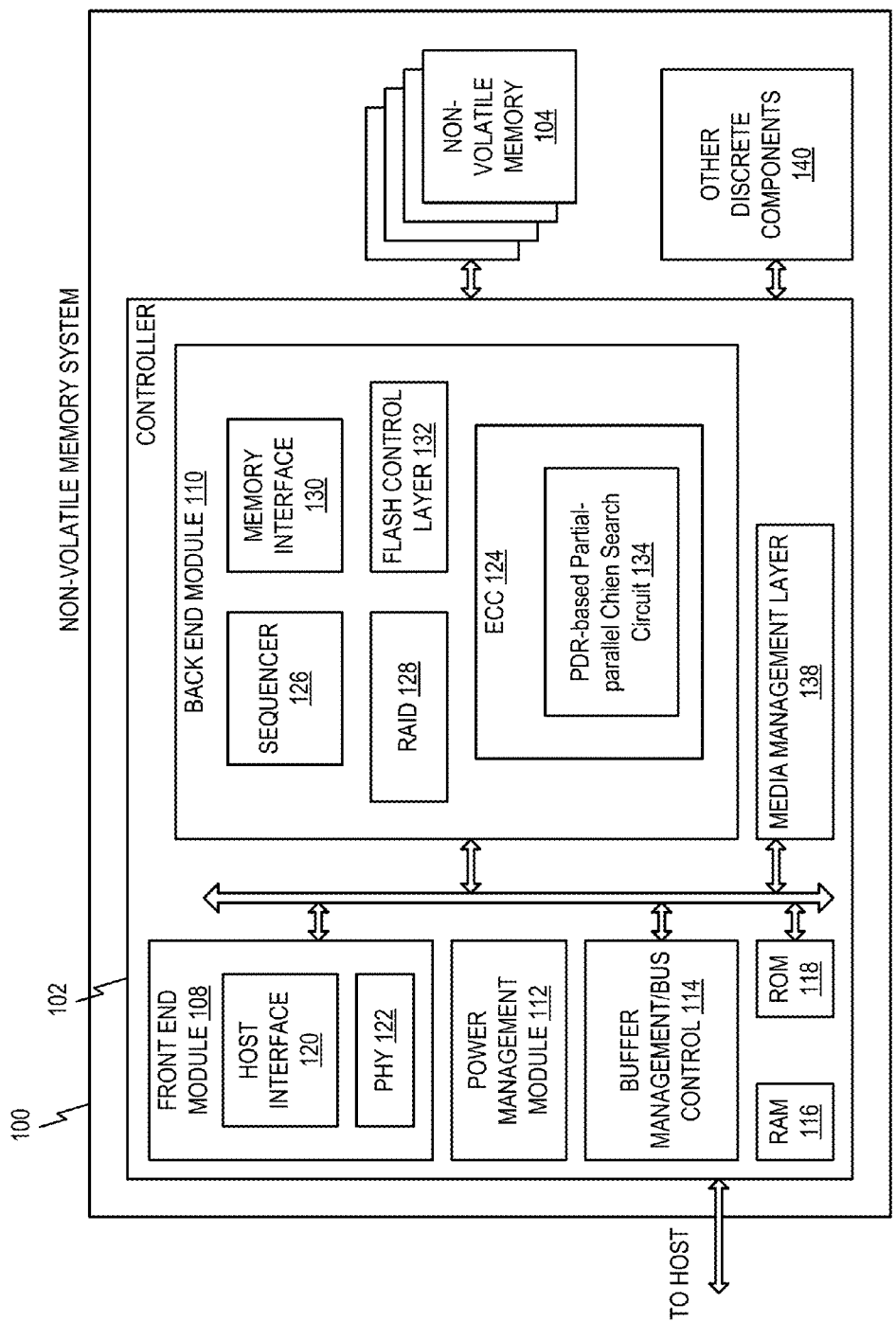
FIG. 2A is a block diagram illustrating exemplary of a non-volatile memory system including a controller that may include a PDR-based partial-parallel Chien search circuit.

FIG. 2A is a block diagram illustrating exemplary components of controller 102 in more detail. Controller 102 includes a front end module 108 that interfaces with a host, a back end module 110 that interfaces with the one or more non-volatile memory die 104, and various other modules that perform other functions. A module may take the form of a packaged functional hardware unit designed for use with other components, a portion of a program code (e.g., software or firmware) executable by a (micro)processor or processing circuitry that usually performs a particular function of related functions, or a self-contained hardware or software component that interfaces with a larger system, for example.

Referring again to modules of the controller 102, a buffer manager/bus controller 114 manages buffers in random access memory (RAM) 116 and controls the internal bus arbitration of the controller 102. A read only memory (ROM) 118 stores system boot code. Although illustrated in FIG. 2A as located within the controller 102, in other embodiments one or both of the RAM 116 and the ROM 118 may be located externally to the controller 102. In yet other embodiments, portions of RAM and ROM may be located both within the controller 102 and outside the controller 102.

Front end module 108 includes a host interface 120 and a physical layer interface (PHY) 122 that provide the electrical interface with the host or next level storage controller. The choice of the type of host interface 120 can depend on the type of memory being used. Examples of host interfaces 120 include, but are not limited to, SATA, SATA Express, SAS, Fibre Channel, USB, PCIe, and NVMe. The host interface 120 typically facilitates transfer for data, control signals, and timing signals.

Back end module 110 includes an error correction code (ECC) engine 124 that encodes the data bytes received from the host, and decodes and error corrects the data bytes read from the non-volatile memory. The ECC engine 124 may include the PDR-based partial-parallel Chien search circuit 134. A command sequencer 126 generates command sequences, such as program and erase command sequences, to be transmitted to non-volatile memory die 104. A RAID (Redundant Array of Independent Drives) module 128 manages generation of RAID parity and recovery of failed data. The RAID parity may be used as an additional level of integrity protection for the data being written into the non-volatile memory die 104. In some cases, the RAID module 128 may be a part of the ECC engine 124. A memory interface 130 provides the command sequences to non-volatile memory die 104 and receives status information from non-volatile memory die 104. In one embodiment, memory interface 130 may be a double data rate (DDR) interface, such as a Toggle Mode 200, 400, or 800 interface. A flash control layer 132 controls the overall operation of back end module 110.

Additional components of system 100 illustrated in FIG. 2A include a power management module 112 and a media management layer 138, which performs wear leveling of memory cells of non-volatile memory die 104. System 100 also includes other discrete components 140, such as external electrical interfaces, external RAM, resistors, capacitors, or other components that may interface with controller 102. In alternative embodiments, one or more of the physical layer interface 122, RAID module 128, media management layer 138 and buffer management/bus controller 114 are optional components that may be omitted from the controller 102.

Figure 2B:
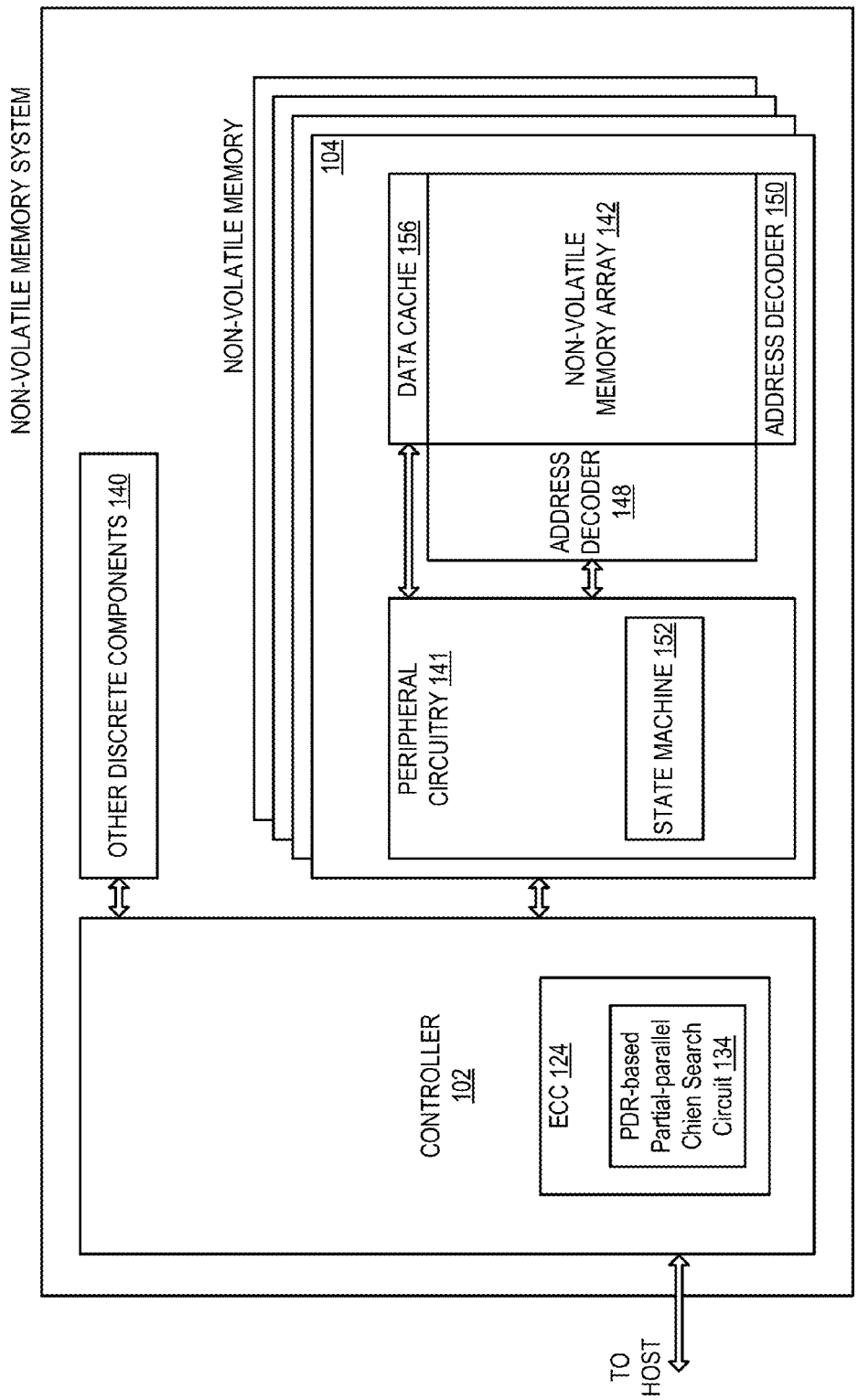
FIG. 2B is a block diagram illustrating exemplary components of a non-volatile memory die that may be coupled to a controller that includes a PDR-based partial-parallel Chien search circuit.

FIG. 2B is a block diagram illustrating exemplary components of non-volatile memory die 104 in more detail. Non-volatile memory die 104 includes peripheral circuitry 141 and non-volatile memory array 142. Non-volatile memory array 142 includes the non-volatile memory cells used to store data. The non-volatile memory cells may be any suitable non-volatile memory cells, including NAND flash memory cells and/or NOR flash memory cells in a two dimensional and/or three dimensional configuration. Peripheral circuitry 141 includes a state machine 152 that provides status information to controller 102. The controller 102 includes the ECC engine 124, which may include the PDR-based partial-parallel Chien search circuit 134. Non-volatile memory die 104 further includes discrete components 140, an address decoder 148, an address decoder 150, and a data cache 156 that caches data.

Figure 3:
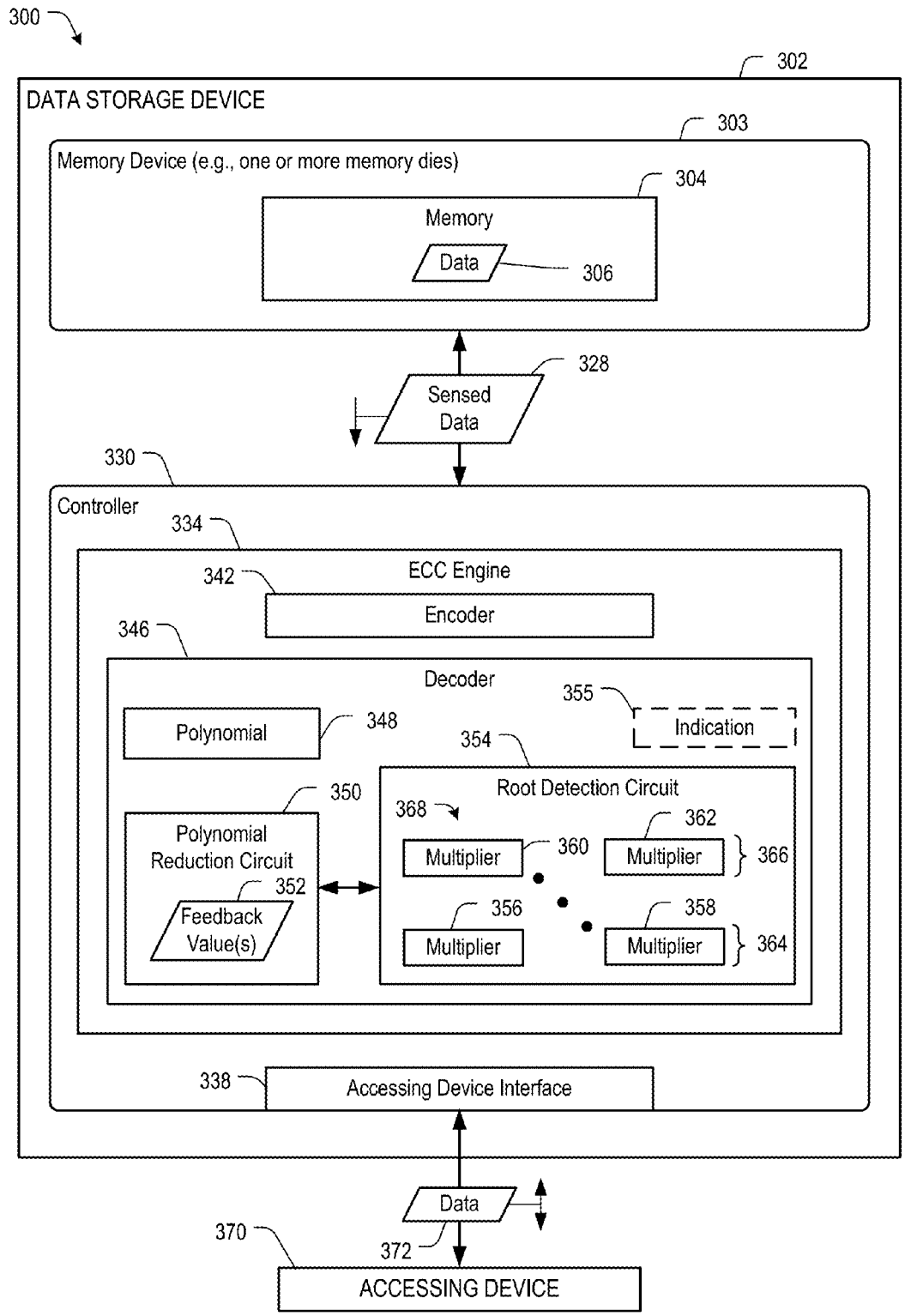
FIG. 3 is a block diagram of a particular illustrative embodiment of a system including a data storage device having decoder with a PDR-based partial-parallel Chien search architecture.

FIG. 3 depicts an illustrative example of a system 300. The system 300 includes a data storage device 302 (e.g., the non-volatile memory system 100) and an accessing device 370 (e.g., the host 252). Although the system 300 of FIG. 3 is described with reference to data storage and retrieval operations for illustration, it should be appreciated that aspects of the disclosure are not limited to such examples. For example, aspects of the disclosure may be implemented in other devices, such as a communication system (e.g., a wireless communication device or a wired communication device, as illustrative examples), or another electronic device.

The data storage device 302 may include a memory device 303. The memory device 303 may include one or more memory dies (e.g., one memory die, two memory dies, eight memory dies, or another number of memory dies). To further illustrate, the memory device 303 may include the non-volatile memory die 104. The memory device 303 includes a memory 304, such as a non-volatile memory of storage elements included in a memory die of the memory device 303. For example, the memory 304 may include a flash memory, such as a NAND flash memory, or a resistive memory, such as a resistive random access memory (ReRAM), as illustrative examples. The memory 304 may have a three-dimensional (3D) memory configuration. As an example, the memory 304 may have a 3D vertical bit line (VBL) configuration. In a particular implementation, the memory 304 is a non-volatile memory having a 3D memory configuration that is monolithically formed in one or more physical levels of arrays of memory cells having an active area disposed above a silicon substrate. Alternatively, the memory 304 may have another configuration, such as a two-dimensional (2D) memory configuration or a non-monolithic 3D memory configuration (e.g., a stacked die 3D memory configuration).

The memory 304 may include one or more regions of storage elements (also referred to herein as memory cells). An example of a storage region is a block, such as a NAND flash erase group of storage elements. Another example of a storage region is a word line of storage elements. A word line may function as a single-level-cell (SLC) word line, as a multi-level-cell (MLC) word line, or as a tri-level-cell (TLC) word line, as illustrative examples. Each storage element of the memory 304 may be programmable to a state (e.g., a threshold voltage in a flash configuration or a resistive state in a resistive memory configuration) that indicates one or more values.

The data storage device 302 may further include a controller 330. The controller 330 may include an ECC engine 334 and an accessing device interface 338 (e.g., a host interface). For example, the ECC engine 334 may include the partial-parallel Chien search circuit 134 and may correspond to the ECC engine 124. As another example, the accessing device interface 338 may correspond to the host interface 120.

The ECC engine 334 may include an encoder 342 and a decoder 346. The decoder 346 may include a polynomial reduction circuit 350 and a root detection circuit 354 (e.g., the partial-parallel Chien search circuit 134) coupled to the polynomial reduction circuit 350. The polynomial reduction circuit 350 may be configured to generate one or more feedback values 352. The encoder 342 may include a Reed-Solomon (RS) encoder, a Bose-Chaudhuri-Hocquenghem (BCH) encoder, an encoder configured to encode data according to one or more other ECC schemes, or a combination thereof. The decoder 346 may include an RS decoder, a BCH decoder, a decoder configured to decode data according to one or more other ECC schemes, or a combination thereof.

The root detection circuit 354 includes multiple sets (e.g., groups or rows) of multipliers. To illustrate, FIG. 3 depicts that the root detection circuit 354 may include multipliers 356, 358, 360, and 362. A first set of multipliers 364 (e.g., a first row of multipliers) may include the multipliers 356, 358. A second set of multipliers 366 (e.g., a second row of multipliers) may include the multipliers 360, 362. Although the example of FIG. 3 depicts two sets of multipliers (the sets of multipliers 364, 366) and four multipliers (the multipliers 356, 358, 360, and 362), it should be appreciated that FIG. 3 is illustrative and that the root detection circuit 354 may include a different number of multipliers and/or sets of multipliers.

Thus, the root detection circuit 354 includes multiple sets of multipliers 368 (i.e., the sets of multipliers 364, 366 in the example of FIG. 3). As used herein, "multiple sets of multipliers" may refer to two or more rows of multipliers, where each such row includes two or more multipliers.

During operation, the controller 330 is configured to receive data and instructions from the accessing device 370 using the accessing device interface 338. For example, the controller 330 may receive data 372 from the accessing device 370 via the accessing device interface 338.

The ECC engine 334 may be configured to receive the data 372. The ECC engine 334 is configured to initiate an encoding process using the data 372, such as by inputting the data 372 to the encoder 342 to generate one or more ECC codewords based on the data 372.

The controller 330 is configured to send data and commands to the memory device 303 and to receive data from the memory device 303. For example, the controller 330 is configured to send data 306 (e.g., one or more ECC codewords generated by the ECC engine 334 based on the data 372) and a write command to cause the memory device 303 to store the data 306 to a specified address of the memory 304. The write command may specify a physical address of a portion of the memory 304 that is to store the data 306.

The controller 330 is configured to send a read command to the memory device 303 to access data from a specified address of the memory 304. For example, the controller 330 may send the read command to the memory device 303 in response to receiving a request for read access from the accessing device 370. The read command may specify a physical address of a portion of the memory 304. For example, the read command may specify the physical address of a portion of the memory 304 storing the data 306.

In response to the read command, the memory device 303 may sense the portion of the memory 304 storing the data 306 to generate sensed data 328 (e.g., a representation of the data 306 that may differ with respect to the data 306 due to one or more bit errors).

The controller 330 is configured to receive the sensed data 328 from the memory device 303. The controller 330 may input the sensed data 328 to the ECC engine 334 to perform a decode operation using the decoder 346 to correct one or more bit errors in the sensed data (if any) up to a particular error correction capability of the particular ECC technique.

The decode operation may be performed based on a polynomial 348. For example, the polynomial 348 may be an error locator polynomial having multiple roots, where each root of the multiple roots corresponds to an error location associated with data (e.g., the sensed data 328) received at the controller 330 from the memory 304. The decode operation may include detecting roots of the polynomial 348 to identify (and correct) one or more errors in the sensed data 328. For example, the decode operation may include multiple iterations, and each error may be detected during a corresponding iteration of the decode operation.

The decoder 346 is configured to use the root detection circuit 354 during the decode operation to identify one or more error locations associated with data (e.g., the sensed data 306) received at the controller 330 from the memory 304, such as by configuring the root detection circuit 354 according to a degree of the polynomial 348. Configuring the root detection circuit 354 may include activating (e.g., powering on) one or more of the sets of multipliers 364, 366. For example, both of the sets of multipliers 364, 366 may be activated. A number of the one or more sets that is activated may be associated with a value of the degree of the polynomial 348. The activated one or more sets of multipliers may be used during a first iteration of the decode operation (e.g., to search for a root of the polynomial 348).

The decoder 346 is configured to detect one or more roots of the polynomial 348. In response to detection of a root of multiple roots of the polynomial 348, the decoder 346 may modify a configuration of the root detection circuit 354 based on a polynomial degree reduction (PDR) scheme. For example, in response to the detection of the root of the polynomial 348, a set of the multiple sets of multipliers 368 may be deactivated in accordance with the PDR scheme. As a non-limiting, illustrative example, the first set of multipliers 364 may be disabled (e.g., powered off) in response to the detection of the root of the polynomial 348.

Each set of multipliers of the multiple sets of multipliers 368 is configured to be disabled in response to identification of a root of the polynomial 348. For example, the first set of multipliers 364 may be configured to be disabled in response to identification of a root (e.g., a first root) of the polynomial 348, and the second set of multipliers 366 may be configured to be disabled in response to identification of another root (e.g., a second root) of the polynomial 348.

After detection of the root, the polynomial reduction circuit 350 may generate the one or more feedback values 352 and may provide the one or more feedback values 352 to at least one set of the multiple sets of multipliers 368. For example, in response to the detection of the root, the decoder 346 may select one or more multiplier output values to be used by the polynomial reduction circuit 350 to generate the one or more feedback values 352. The one or more multiplier output values may include a single multiplier output from each of one or more sets of the multiple sets of multipliers 368 (e.g., output values of a particular column of the multiple sets of multipliers 368 that corresponds to the detected root). In an illustrative implementation, generating the one or more feedback values 352 includes combining outputs of multipliers included in the multiple sets of multipliers 368.

After detecting the root and deactivating the set of multipliers, the next iteration of the root detection may be initiated (e.g., to identify another root of the polynomial 348 while the first set of multipliers 364 is disabled). The decode operation may continue (e.g., by finding one or more additional roots of the polynomial 348 using a degree-reduced polynomial having roots that are a subset of the roots of the polynomial 348) until all roots of the polynomial 348 have been identified. In the example of FIG. 3, if the decode operation generates a valid ECC codeword, the ECC engine 334 may output the data 372, and the controller 330 may provide the data 372 to the accessing device 370 using the accessing device interface 338.

In some cases, the decode operation may fail (e.g., if a number of errors of the sensed data 328 exceeds an error correction capability associated with the particular ECC scheme). As an example, if the Chien search detects a particular root during multiple iterations, then the sensed data 328 may not be decodable (due to a number of errors exceeding an error correction capability associated with the particular ECC scheme). In this example, operation of the decoder 346 may optionally include generating an indication 355 that data (e.g., the sensed data 328) received at the controller 330 from the memory 304 is not decodable in response to determining that a first root detected by the root detection circuit 354 and a second root detected by the root detection circuit 354 are the same root.

The examples illustrated with reference to FIG. 3 may enable reduced power consumption during a decode operation. For example, a first amount of power consumed by the root detection circuit 354 during a first processing iteration (e.g., while the root detection circuit 354 is configured according to a first degree of the polynomial 348) may be more than a second amount of power consumed by the root detection circuit 354 during a second processing iteration (e.g., while the root detection circuit 354 is configured according to a second degree of the polynomial 348 that is a lower degree as compared to the first degree). Accordingly, modifying a configuration of the root detection circuit 354 in response to detection of a root of the polynomial 348 may reduce power consumption associated with a decode operation.

To further illustrate certain advantages and benefits of the disclosure as compared to conventional decoders, consider a conventional device that utilizes an (n, k) t-error-correcting BCH code over $GF(2^q)$. The degree of the error locator polynomial $f(x)=f_0+f_1 x+f_2 x^2+\ldots$ is at most t. If the polynomial degree is less than four, the roots can be computed directly using simple hardware. Otherwise, a Chien search may be used to test each finite field element. The Chien search computes $f(\alpha^i)$ for $i=0, 1, \ldots, n-1$, where $\alpha$ is a primitive element of $GF(2^q)$, and where n is at most $2^q-1$.

To find the roots of a degree-t polynomial, a serial Chien search architecture may use t feedback loops including registers and constant multipliers. The multiplexors pass the coefficients of f(x) in clock cycle 0 and select the outputs of the constant multipliers in other clock cycles. Hence, the output of the jth register in clock cycle i is $f_j(\alpha^i)^j = f_j(\alpha^i)^j$.

If the number of actual errors is $v \leq t$, then $\deg(f(x))=v$. To reduce power consumption, the hardware units associated with the coefficients for the terms with degrees higher than v can be disabled from the beginning. In addition, if the number of roots found is already v, then there will be no additional roots and the entire Chien search engine can be deactivated.

Some conventional serial Chien search devices may attempt to reduce the degree of the error locator polynomial on the fly whenever a root is found. If $\alpha^i$ is a root of f(x), then the search over the rest of the field elements can be performed on $f'(x)=f(x)/(x+\alpha^i)$ instead. In this case, the degree of the error locator polynomial is reduced by one and hence the hardware units for one more coefficient can be deactivated each time a root is found. However, deriving the coefficients of f'(x) from those of f(x) by polynomial division increases latency. In addition, $\alpha^{i+1}, \alpha^{2(i+1)}, \alpha^{3(i+1)}, \ldots$ need to be multiplied to the coefficients of f'(x) to derive the evaluation value over the next field element, $\alpha^{i+1}$, and are not available in the Chien search architecture. Instead, a device may directly compute $f'_j(\alpha^{i+1})^j$ from $f_j(\alpha^i)^j$ (e.g., from the outputs of registers) using adders. Then $f'_j(\alpha^{i+1})^j$ are fed back to the multipliers and $f'(\alpha^{i+1})$ can be derived using a summation circuit, such as an adder tree that adds the outputs of the multipliers. According to long division, f'(x) can be expressed as in Equations (1):

$$f'(x) = f'_{v-1}x^{v-1} + f'_{v-2}x^{v-2} + f'_{v-3}x^{v-3} + \ldots \quad (1)$$
$$= f_v x^{v-1} + (\alpha^i f_v + f_{v-1})x^{v-2} +$$
$$(\alpha^{2i} f_v + \alpha^i f_{v-1} + f_{v-2})x^{v-3} + \ldots$$

Therefore, $f'(\alpha^{i+1})$ can be written as:

$$f'(\alpha^{i+1}) = f_v \alpha^{(v-1)(i+1)} + (\alpha^i f_v + f_{v-1})\alpha^{(v-2)(i+1)} +$$
$$(\alpha^{2i} f_v + \alpha^i f_{v-1} + f_{v-2})\alpha^{(v-3)(i+1)} + \ldots$$
$$= f_v \alpha^{vi} \alpha^{-i-1} + (f_v \alpha^{vi} + f_{v-1} \alpha^{(v-1)i})\alpha^{v-i-2} +$$
$$(f_v \alpha^{vi} + f_{v-1} \alpha^{(v-1)i} + f_{v-2} \alpha^{(v-2)i})\alpha^{v-i-3} \div \ldots$$

Since $\alpha^{-i}$ is nonzero, it can be taken out of this formula without affecting whether $\alpha^{i+1}$ is a root of f'(x). Hence, $f'(\alpha^{i+1})$ can be computed instead as in Equation (2):

$$f'(\alpha^{i+1})=f_v\alpha^{vi}\alpha^{v-1}+(f_v\alpha^{vi}+f_{v-1}\alpha^{(i-1)i})\alpha^{v-2}+$$
$$(f_v\alpha^{vi}+f_{v-1}\alpha^{(v-1)i}+f_{v-2}\alpha^{(v-2)i})\alpha^{v-3}+\ldots \quad (2)$$

As explained above, $f_j(\alpha^{ji})$ are available at register outputs in clock cycle i in a serial Chien search architecture and can be summed to derive each of the terms in Equation (2). The terms may be loaded into the registers and multiplied with corresponding powers of $\alpha$ using constant multipliers in the feedback loops in the next clock cycle. Then, at the beginning of the subsequent clock cycle, the value held in register j is a scaled version of $f'_j(\alpha^{j(i+1)})$ for $1 \leq j \leq v-1$. Hence, the search over the remaining field elements may continue. Considering that one extra clock cycle is used every time a root is found, the entire Chien search using this scheme takes v more clock cycles if the degree of the original error locator polynomial is v.

Although the intermediate results generated by the adder tree can be shared to compute some of the sum terms in Equation (2), taking a large number of outputs from the adder tree may significantly increase the power consumption. Hence, separate PDR circuitry is employed to derive the sum terms for Equation (2). The outputs of this circuitry are loaded into the registers in the next clock cycle. Since it is known that $f'_t$ is zero, its corresponding term does not need to be computed. Although the PDR block brings area overhead, it may be only activated for one clock cycle every time a root is found. On the other hand, the average power consumption of the rest of the circuit is substantially reduced because the degree of the polynomial is reduced by one, and hence the hardware units corresponding to a higher coefficient can be turned off each time a root is found. Turning off the entire Chien search engine after the last root is found has diminishing power saving as t increases. On the contrary, the on-the-fly PDR scheme would lead to more power reduction for larger t.

To increase throughput, partial-parallel Chien search may be performed. For example, a device may test L finite field elements in each clock cycle. Similar to the serial architecture, the device may include multiplexors to select the polynomial coefficients in clock cycle 0, and may pass the outputs of the constant multipliers in other clock cycles. The value held by the jth register in clock cycle i is $f_j(\alpha^{Li})^j$ in this example. A constant multiplier over GF($2^q$) can be implemented using q×q binary constant matrix multiplication. Substructure sharing can be applied to reduce the gate count of each constant multiplier and also across multipliers that have the same inputs. Substructure sharing may be further extended to the terms that are to be added up in different columns. Finite field multiplications are alternatively interpreted as polynomial multiplications followed by modulo reductions. In some devices, polynomial modulo reduction for each multiplier is delayed until after the addition operations at the end of the columns. Although an on-the-fly PDR scheme may lead to substantial power reduction for serial Chien search, it cannot be applied to certain partial-parallel architectures. Because $f_j(\alpha^{Li})^j$ are held in the registers and the root found in clock cycle i may be $\alpha^{Li+p}$ (0≤p≤L), neither $f'(\alpha^{Li+p+1})$ nor $f'(\alpha^{L(i+1)+p})$ can be expressed as the sums of the values held in the registers multiplied by $\alpha^{Li}$ in a similar way as that in Equation (2), which may be necessary to use existing constant multipliers.

A decode operation in accordance with the present disclosure uses an on-the-fly PDR-based partial-parallel Chien search. To illustrate, a root $\alpha^i$ of the polynomial 348 is detected (e.g., by the root detection circuit 354), and the next field element to be tested may be $\alpha^r$, where i and r are assumed in the following equations to be arbitrary integers. The coefficients of f'(x) may correspond to those of Equations (1). This implies Equation (3):

$$f'(\alpha^r)=f_v\alpha^{(v-1)r}+(\alpha^i f_v+f_{v-1})\alpha^{(v-2)r}+ (\alpha^{2i}f_v+\alpha^i f_{v-1}+f_{v-2})\alpha^{(v-3)r}+\ldots \quad (3)$$

If the intermediate values that are available from the partial-parallel Chien search architecture in the clock cycle that $\alpha^i$ is found to be a root are $f_v\alpha^{vs}$, $f_{v-1}\alpha^{(v-1)s}$, $f_{v-2}\alpha^{(v-2)s}$, ..., then the terms in Equation (3) may be expressed to make use of these available values, such as in Equations (4):

$$f_v\alpha^{(v-1)r} = (f_v\alpha^{vs}\alpha^{(v-1)(r-s)})\alpha^{-s}$$
$$(\alpha^i f_v + f_{v-1})\alpha^{(v-2)r} = (f_v\alpha^{vs}\alpha^{(v-2)(r-s)})\alpha^{i-2s} + (f_{v-1}\alpha^{(v-1)s}\alpha^{(v-2)(r-s)})\alpha^{-s}$$
$$(\alpha^{2i}f_v + \alpha^i f_{v-1} + f_{v-2})\alpha^{(v-3)r} = (f_v\alpha^{vs}\alpha^{(v-3)(r-s)})\alpha^{2i-3s} + (f_{v-1}\alpha^{(v-1)s}\alpha^{(v-3)(r-s)})\alpha^{i-2s} + (f_{v-2}\alpha^{(v-2)s}\alpha^{(v-3)(r-s)})\alpha^{-s}$$
$$\ldots \quad (4)$$

Constant finite field multipliers may be more expensive than adders. For example, on average, a constant multiplier over GF($2^{15}$) constructed using the irreducible polynomial $x^{15}+x+1$ needs 64 exclusive-or (XOR) gates if 8 intermediate terms are allowed to be shared in each binary matrix multiplication. On the other hand, each adder over GF($2^{15}$) only has 15 XOR gates. Further, the data path of a multiplier may include multiple logic gates, while that of an adder may include one XOR gate. Ideally, the calculations in Equation (4) should be performed by reusing existing multipliers instead of introducing new multipliers. In addition, the number of multiplications needed should be reduced to decrease the latency and complexity of routing the signals to different multipliers. Each equation in Equations (4), except the first equation, includes multiple terms on the right-hand side. The circuitry for calculating each row of Equations (4) would be greatly simplified if the available values, $f_v\alpha^{vs}$, $f_{v-1}\alpha^{(v-1)s}$, $f_{v-2}\alpha^{(v-2)s}$, ..., in each term are added up before they are multiplied with any power of $\alpha$. This requires that the powers of $\alpha$ multiplied to each term in the same row of Equations (4) are the same. To achieve this goal, $\alpha^{i-2s}=\alpha^{-s}$, $\alpha^{2i-3s}=\alpha^{i-2s}$, ... should be satisfied. This implies i=s, which means that, if $\alpha^i$ is a root, then the outputs of the multipliers in the corresponding column should be utilized in the computation of $f'(\alpha^r)$.

Similarly, $\alpha^{-s} \neq 0$ may be taken out of Equations (4). As a result, to determine whether $f'(\alpha^r)$ is zero, $f'(\alpha^r)$ may be computed according to Equation (5):

$$f'(\alpha^r)=f_v\alpha^{vi}\alpha^{(v-1)(r-i)}+(f_v\alpha^{vi}+f_{v-1}\alpha^{(v-1)i})\alpha^{(v-2)(r-i)}+ (f_v\alpha^{vi}+f_{v-1}\alpha^{(v-1)i}+f_{v-2}\alpha^{(v-2)i})\alpha^{(v-3)(r-i)}+\ldots \quad (5)$$

The multipliers in the feedback loops of a conventional partial-parallel Chien search architecture are for $\alpha^{(v-1)L}$, $\alpha^{(v-2)L}$, $\alpha^{(v-3)L}$, ... and those in each of the other columns are for $\alpha^{(v-1)l}$, $\alpha^{(v-2)l}$, $\alpha^{(v-3)l}$, ... (0<l<L) From Equation (5), if the sum terms $f_v\alpha^{vi}$, ($f_v\alpha^{vi}+f_{v-1}\alpha^{(v-1)i}$), ($f_v\alpha^{vi}+f_{v-1}\alpha^{(v-1)i}+f_{v-2}\alpha^{(v-2)s}$), ... are passed through the multiplexors in the feedback loops, then the outputs of this L-parallel architecture in the next clock cycle would be $f'(\alpha^i)$, $f'(\alpha^{i+1})$, ..., $f'(\alpha^{i+L-1})$. If i'=i(mod L), then the search over $\alpha^i$, $\alpha^{i+1}$, ..., $\alpha^{i+L-1-i'}$ is repeated in the next clock cycle. Although these computations may be unnecessary to find if these elements are roots of the error locator polynomial, repeated testing over $\alpha^i$ may help to identify whether $\alpha^i$ is a non-simple root, in which case the received word (e.g., the sensed data 328) is undecodable (and hence the Chien search may be terminated, as described with reference to FIG. 3). Otherwise, in the next clock cycle, $f_v\alpha^{vi}\alpha^{(v-1)L}$, ($f_v\alpha^{vi}+f_{v-1}\alpha^{(v-1)i})\alpha^{(v-2)L}$, ($f_v\alpha^{vi}+f_{v-1}\alpha^{(v-1)i}+f_{v-2}\alpha^{(v-2)s})\alpha^{(v-3)L}$, ... are computed by the multipliers in the feedback loops. They can be loaded in to the registers at the clock cycle after, from which the normal partial-parallel Chien search resumes with only the first v–1 rows of hardware units activated. In the case that more than one root is found in a clock cycle, each root may be managed using a PDR scheme in separate clock cycles (e.g., by managing one root during one clock cycle using the PDR scheme and by managing another root during a subsequent clock cycle using the PDR scheme).

Figure 4:
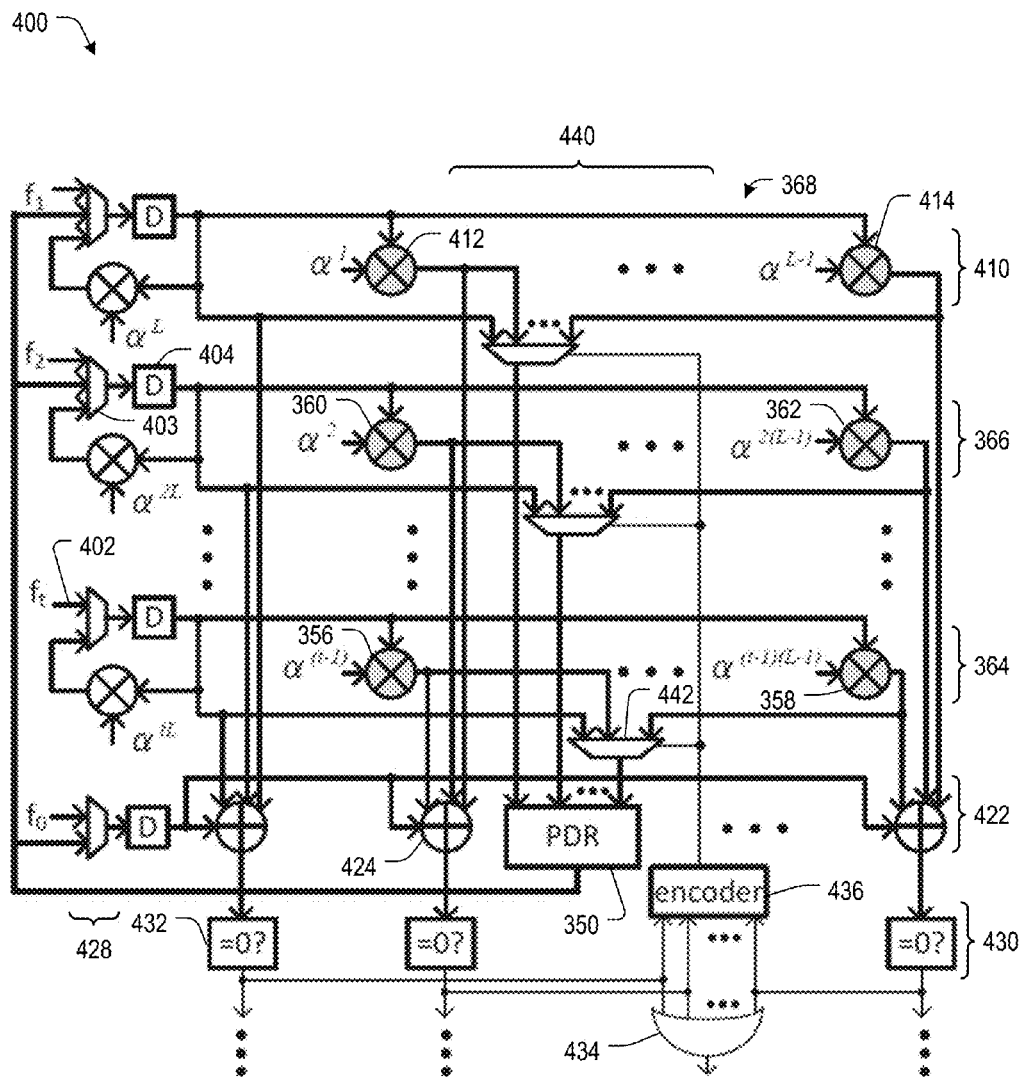
FIG. 4 is a diagram of an example of a decoder having a PDR-based partial-parallel Chien search architecture.

FIG. 4 illustrates a decoder 400 having an L-parallel Chien search architecture with on-the-fly PDR in accordance with the present disclosure. In FIG. 4, certain structures and operations may be as described with reference to FIG. 3. For example, the decoder 400 may be integrated within the decoder 346 of FIG. 3. To further illustrate, the decoder 400 may include the multiple sets of multipliers 368 (including the first set of multipliers 364 and the second set of multipliers 366, which include the multipliers 356, 358, 360, and 362). In FIG. 4, the multiple sets of multipliers 368 further includes a third set (e.g., group or row) of multipliers 410, which includes a multiplier 412 and a multiplier 414. The decoder 400 may further include the polynomial reduction circuit 350. Although the root detection circuit 354 is not labeled in FIG. 4, it should be appreciated that certain structures and operations of the decoder 400 of FIG. 4 may be as described with reference to the root detection circuit 354 of FIG. 3 (e.g., the decoder 400 includes the multiple sets of multipliers 368 of the root detection circuit 354).

The decoder 400 includes multiple inputs, such as a representative input 402. Each input of the multiple inputs is configured to receive a corresponding coefficient ($f_1$, $f_2$, $f_t$, or $f_0$) associated with a polynomial (e.g., the polynomial 348). Accordingly, the multiple inputs are configured to receive a set of values ($f_1$, $f_2$, $f_t$, and $f_0$) that are associated with each coefficient of an error locator polynomial (e.g., the polynomial 348).

The decoder 400 also includes multiple registers, such as a representative register 404. Each register of the multiple registers corresponds to a set of the multiple sets of multipliers 368. For example, the register 404 corresponds to the second set of multipliers 366. Each register of the multiple registers may be configured to provide an input value (e.g., $f_0 \ldots f_t$) on an initial iteration, to provide a multiplier output in subsequent iterations, and to provide a feedback value in response to detection of a root of a polynomial (e.g., the polynomial 348). For example, the register 404 may be configured to provide a feedback value from the polynomial reduction circuit 350 to each multiplier of the second set of multipliers 366 in response to detection of the root. The feedback values may correspond to the one or more feedback values 352.

The decoder 400 further includes a set of adders 422. Each adder of the set of adders 422 may be configured to receive a corresponding set of multiplier outputs (e.g., from a column of multipliers) of the multiple sets of multipliers 368. To illustrate, the set of adders 422 includes a representative adder 424. The adder 424 may be configured to receive a first set of multiplier output values from a column of multipliers that includes the multipliers 356, 360, and 412.

The polynomial reduction circuit 350 may be configured to generate one or more feedback values (e.g., the one or more feedback values 352) to be provided to one or more sets of the multiple sets of multipliers 368 in response to detection of a root. For example, FIG. 4 illustrates that the polynomial reduction circuit 350 is configured to provide one or more feedback values to a plurality of multiplexors 428 coupled to the multiple registers. As a particular example, the polynomial reduction circuit 350 may be configured to provide a feedback value to each multiplier of the second set of multipliers 366 via a representative multiplexor 403 and via the register 404.

The decoder 400 further includes control circuitry 440 configured to selectively activate the polynomial reduction circuit 350 in response to detection of a root. For example, the control circuitry 440 may include a plurality of L-to-1 multiplexors, where each of the L-to-1 multiplexors corresponds to one of the multiple groups of multipliers 368. To illustrate, FIG. 4 depicts a representative L-to-1 multiplexor 442 that corresponds to the first set of multipliers 364. The control circuitry 440 may be further configured to select one or more multiplier output values of the multiple groups of multipliers 368 to be used by the polynomial reduction circuit 350 to generate the one or more feedback values. The one or more multiplier output values may include a single multiplier output from each of one or more sets of the multiple sets of multipliers 368.

The decoder 400 also includes multiple zero-tester circuits 430, such as a representative zero tester circuit 432. The multiple zero-tester circuits 430 are coupled to an OR gate 434. The multiple zero-tester circuits 430 are configured to provide outputs to the OR gate 434.

The OR gate 434 may be configured to generate an output based on the outputs provided from the multiple zero-tester circuits 430. The output of the OR gate 434 may function as a clock gating signal to the polynomial reduction circuit 350. If the output of the OR gate 434 is asserted during a particular clock cycle, an L-input priority encoder 436 may generate the index of the first root found in that clock cycle. The L-input priority encoder 436 may be configured to generate outputs that function as select signals of the L-to-1 multiplexors, such as the L-to-1 multiplexor 442.

The polynomial reduction circuit 350 is configured to perform PDR operations in accordance with a PDR scheme. To reduce data path length, whenever the output of the OR gate 434 is asserted, the multiple registers (e.g., the register 404) may be configured to store (or "hold") the current values. After holding the current values in the multiple registers, the polynomial reduction circuit 350 may perform PDR operations in the next clock cycle. In this example, the decoder 400 may function in a pipelined manner (by holding values of a particular clock cycle in the multiple registers to enable the polynomial reduction circuit 350 to perform PDR operations in the next clock cycle). In this case, two extra clock cycles may be used for PDR operations whenever a root is found using the partial-parallel architecture.

Figure 5:
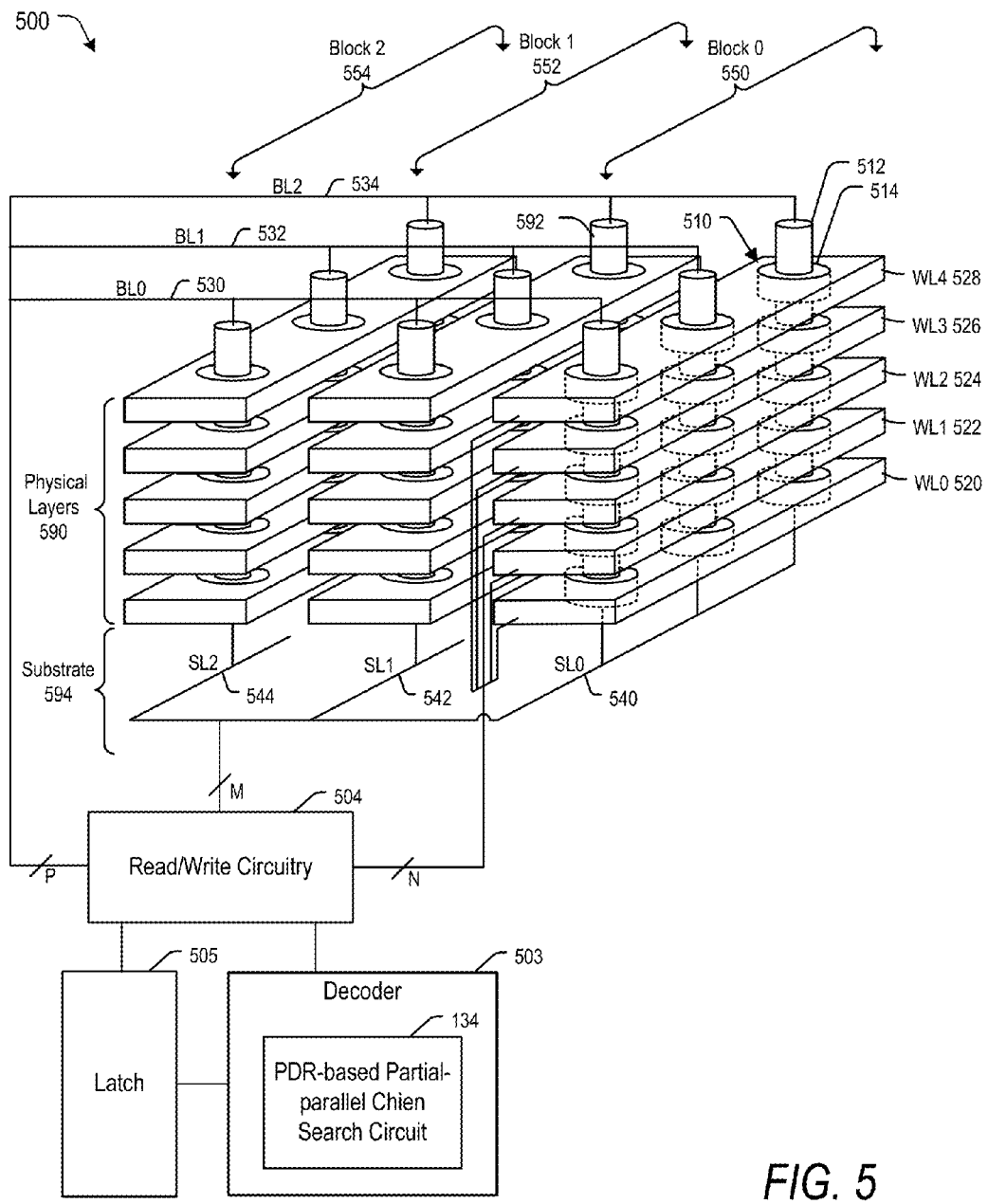
FIG. 5 is a diagram of an illustrative embodiment of a portion of a memory die.
Figure 6:
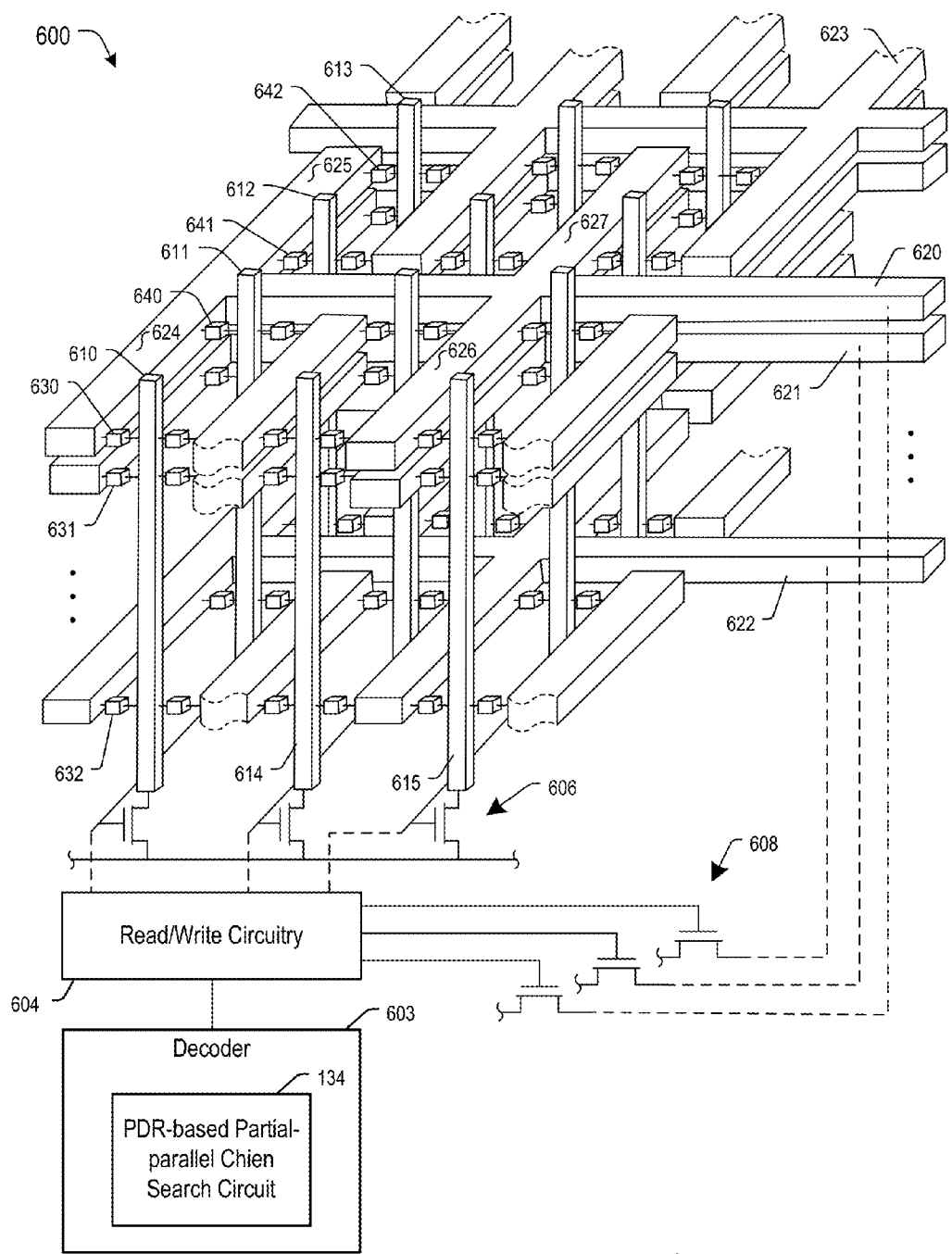
FIG. 6 is a diagram of another illustrative embodiment of a portion of a memory die.

FIGS. 5 and 6 illustrate certain examples of monolithic 3D memory configurations. It should be appreciated that FIGS. 5 and 6 are provided for illustration and that other implementations may utilize one or more other configurations, such as a planar memory configuration or a stacked die memory configuration, as illustrative examples. Alternatively or in addition, one or more aspects of the disclosure may be used in connection with another device, such as a communication system, as an illustrative example.

FIG. 5 illustrates a portion of a memory die 500 having a NAND flash configuration. The memory die 500 may be included in the data storage device 302 of FIG. 3. For example, the memory die 500 may correspond to the memory device 303 of FIG. 3. The memory die 500 may be coupled to the controller 330 of FIG. 3.

The memory die 500 may include read/write circuitry 504 and one or more latches (e.g., a latch 505). The memory die 500 may be configured to perform ECC operations. For example, the memory die 500 may include a decoder 503 that includes the PDR-based partial-parallel Chien search circuit 134. The decoder 503 may correspond to the decoder 346 of FIG. 3.

The memory die 500 includes multiple physical layers, such as a group of physical layers 590. The multiple physical layers are monolithically formed above a substrate 594, such as a silicon substrate. Storage elements (e.g., memory cells), such as a representative memory cell 510, are arranged in arrays in the physical layers.

The representative memory cell 510 includes a charge trap structure 514 between a word line/control gate (WL4) 528 and a conductive channel 512. Charge may be injected into or drained from the charge trap structure 514 via biasing of the conductive channel 512 relative to the word line 528. For example, the charge trap structure 514 may include silicon nitride and may be separated from the word line 528 and the conductive channel 512 by a gate dielectric, such as silicon oxide. An amount of charge in the charge trap structure 514 affects an amount of current through the conductive channel 512 during a read operation of the memory cell 510 and indicates one or more bit values that are stored in the memory cell 510.

The memory die 500 includes multiple erase blocks, including a first block (block 0) 550, a second block (block 1) 552, and a third block (block 2) 554. Each block 550-554 includes a "vertical slice" of the physical layers 590 that includes a stack of word lines, illustrated as a first word line (WL0) 520, a second word line (WL1) 522, a third word line (WL2) 524, a fourth word line (WL3) 526, and a fifth word line (WL4) 528. Multiple conductive channels (having a substantially vertical orientation with respect to FIG. 5) extend through the stack of word lines. Each conductive channel is coupled to a storage element in each word line 520-528, forming a NAND string of storage elements. FIG. 5 illustrates three blocks 550-554, five word lines 520-528 in each block, and three conductive channels in each block for clarity of illustration. However, the memory die 500 may have more than three blocks, more than five word lines per block, and more than three conductive channels per block.

The read/write circuitry 504 is coupled to the conductive channels via multiple conductive lines, illustrated as a first bit line (BL0) 530, a second bit line (BL1) 532, and a third bit line (BL2) 534 at a "top" end of the conducive channels (e.g., farther from the substrate 594). The read/write circuitry 504 is also coupled to the conductive channels via multiple source lines, such as via a first source line (SL0) 540, a second source line (SL1) 542, and a third source line (SL2) 544 at a "bottom" end of the conductive channels (e.g., nearer to or within the substrate 594). The read/write circuitry 504 is illustrated as coupled to the bit lines 530-534 via "P" control lines, coupled to the source lines 540-544 via "M" control lines, and coupled to the word lines 520-528 via "N" control lines. Each of P, M, and N may have a positive integer value based on the specific configuration of the memory die 500. In the illustrative example of FIG. 5, P=3, M=3, and N=5.

In a particular embodiment, each of the bit lines and each of the source lines may be coupled to the same end (e.g., the top end or the bottom end) of different conductive channels. For example, a particular bit line may be coupled to the top of a conductive channel 592 and a particular source line may be coupled to the top of the conductive channel 512. The bottom of the conductive channel 592 may be coupled (e.g., electrically coupled) to the bottom of the conductive channel 512. Accordingly, the conductive channel 592 and the conductive channel 512 may be coupled in series and may be coupled to the particular bit line and the particular source line.

In operation, the memory die 500 may perform write operations and read operations, such as in response to receiving commands from the controller 330. For a write operation, the controller 330 may receive a request for write access from the accessing device 370. The request may include data (e.g., the data 372) to be written at storage elements of the memory die 500. The controller 330 may send a command to the memory die 500 to cause the memory die 500 to initiate the write operation. For example, the controller 330 may send a write opcode and a physical address to the read/write circuitry 504 and data to the latch 505.

The read/write circuitry 504 may be configured to access the data in the latch 505 and to program the data to storage elements of the memory die 500 based on one or more write parameters indicated by the particular command. For example, the read/write circuitry 504 may be configured to apply selection signals to control lines coupled to the word lines 520-528, the bit lines 530-534, and the source lines 540-542 to cause a programming voltage (e.g., a voltage pulse or series of voltage pulses) to be applied across one or more selected storage elements of the selected word line (e.g., the word line 528, as an illustrative example).

For a read operation, the controller 330 may receive a request for read access from the accessing device 370. The controller 330 may cause the read/write circuitry 504 to read bits from particular storage elements of the memory die 500 by applying appropriate signals to the control lines to cause storage elements of a selected word line to be sensed. In the illustrative example of FIG. 5, the memory die 500 may include a decoder configured to decode sensed data (e.g., the sensed data 328) using the PDR-based partial-parallel Chien search circuit 134 to generate decoded data using an in-memory decode operation. The memory die 500 may be configured to provide the decoded data to the controller 330.

FIG. 6 illustrates a portion of a memory die 600 having a ReRAM configuration. The memory die 600 may be included in the data storage device 302 of FIG. 3. For example, the memory die 600 may correspond to the memory device 303 of FIG. 3. The memory die 600 may be coupled to the controller 330 of FIG. 3.

The memory die 600 may include read/write circuitry 604. The memory die 600 may be configured to perform ECC operations. For example, the memory die 600 may include a decoder 603 that includes the PDR-based partial-parallel Chien search circuit 134. The decoder 603 may correspond to the decoder 346 of FIG. 3.

In the example of FIG. 6, the memory die 600 includes a vertical bit line (VBL) ReRAM with a plurality of conductive lines in physical layers over a substrate (e.g., substantially parallel to a surface of the substrate), such as representative word lines 620, 621, 622, and 623 (only a portion of which is shown in FIG. 6). The VBL ReRAM also includes a plurality of vertical conductive lines through the physical layers, such as representative bit lines 610, 611, 612, and 613. The word line 622 may include or correspond to a first group of physical layers, and the word lines 620, 621 may include or correspond to a second group of physical layers.

The memory die 600 also includes a plurality of resistance-based storage elements (e.g., memory cells), such as representative storage elements 630, 631, 632, 640, 641, and 642. Each of the storage elements 630, 631, 632, 640, 641, and 642 is coupled to (or is associated with) a bit line and a word line in arrays of memory cells in multiple physical layers over the substrate (e.g., a silicon substrate).

In the example of FIG. 6, each word line includes a plurality of fingers. To illustrate, the word line 620 includes fingers 624, 625, 626, and 627. Each finger may be coupled to more than one bit line. For example, the finger 624 of the word line 620 is coupled to the bit line 610 via the storage element 630 at a first end of the finger 624, and the finger 624 is further coupled to the bit line 611 via the storage element 640 at a second end of the finger 624.

In the example of FIG. 6, each bit line may be coupled to more than one word line. To illustrate, the bit line 610 is coupled to the word line 620 via the storage element 630, and the bit line 610 is further coupled to the word line 622 via the storage element 632.

In operation, the memory die 600 may perform write operations and read operations, such as in response to receiving commands from the controller 330 of FIG. 3. For a write operation, the controller 330 of FIG. 3 may receive data (e.g., the data 372 of FIG. 3) from a host device, such as the accessing device 370 of FIG. 3. The controller 330 may send a command to the memory die 600 to cause the memory die 600 to initiate the write operation. The controller 330 may send data to the memory die 600 to be written to storage elements of the memory die 600.

The read/write circuitry 604 may be configured to program the data to storage elements corresponding to the destination of the data. For example, the read/write circuitry 604 may apply selection signals to selection control lines coupled to the word line drivers 608 and the bit line drivers 606 to cause a write voltage to be applied across a selected storage element. As an illustrative example, to select the storage element 630, the read/write circuitry 604 may activate the word line drivers 608 and the bit line drivers 606 to drive a programming current (also referred to as a write current) through the storage element 630. To illustrate, a first write current may be used to write a first logical value (e.g., a value corresponding to a high-resistance state) to the storage element 630, and a second write current may be used to write a second logical value (e.g., a value corresponding to a low-resistance state) to the storage element 630. The programming current may be applied by generating a programming voltage across the storage element 630 by applying a first voltage to the bit line 610 and to word lines other than the word line 620 and by applying a second voltage to the word line 620. In a particular embodiment, the first voltage is applied to other bit lines (e.g., the bit lines 614, 615) to reduce leakage current in the memory die 600.

For a read operation, the controller 330 may receive a request from a host device, such as the accessing device 370 of FIG. 1. The controller 330 may issue a command to the memory die 600 specifying one or more physical addresses of the memory die 600.

The memory die 600 may cause the read/write circuitry 604 to read bits from particular storage elements of the memory die 600, such as by applying selection signals to selection control lines coupled to the word line drivers 608 and the bit line drivers 606 to cause a read voltage to be applied across a selected storage element. For example, to select the storage element 630, the read/write circuitry 604 may activate the word line drivers 608 and the bit line drivers 606 to apply a first voltage (e.g., 0.7 volts (V)) to the bit line 610 and to word lines other than the word line 620. A lower voltage (e.g., 0 V) may be applied to the word line 620. Thus, a read voltage is applied across the storage element 630, and a read current corresponding to the read voltage may be detected at a sense amplifier of the read/write circuitry 604. The read current corresponds (via Ohm's law) to a resistance state of the storage element 630, which corresponds to a logic value stored at the storage element 630. In the illustrative example of FIG. 6, the memory die 600 may include a decoder configured to decode sensed data (e.g., the sensed data 328) using the PDR-based partial-parallel Chien search circuit 134 to generate decoded data using an in-memory decode operation. The memory die 600 may be configured to provide the decoded data to the controller 330.

Figure 7:
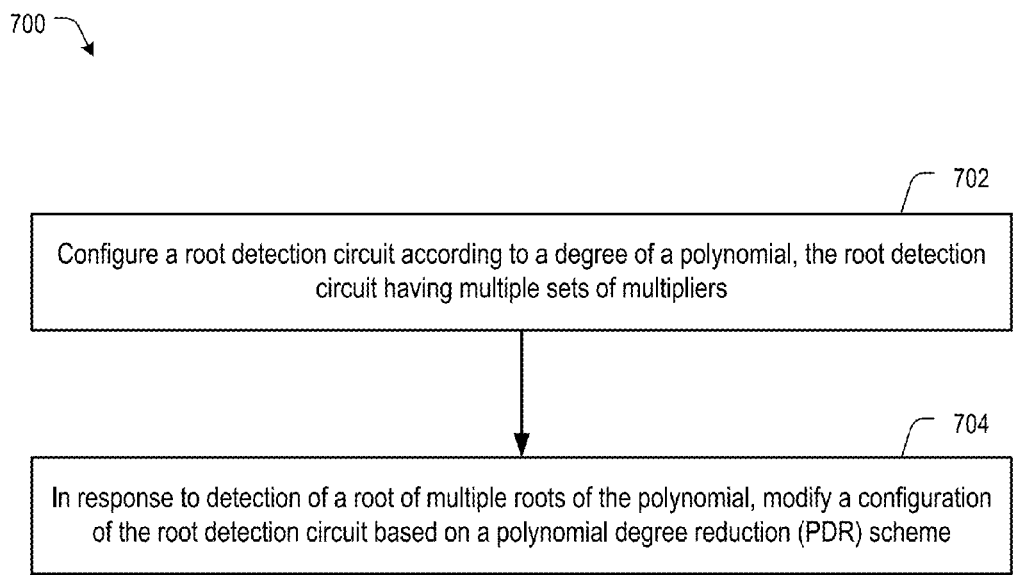
FIG. 7 is a flow diagram of an illustrative embodiment of a method of operation of a device.

Referring to FIG. 7, an illustrative example of a method is depicted and generally designated 700. The method 700 may be performed in a device (e.g., the data storage device 302) that includes a controller (e.g., the controller 330). The controller includes a root detection circuit (e.g., the root detection circuit 354) having multiple sets of multipliers (e.g., the multiple sets of multipliers 368).

The method 700 includes configuring the root detection circuit according to a degree of a polynomial (e.g., the polynomial 348), at 702. For example, one or more of the multiple sets of multipliers 368 may be activated or deactivated based on a degree of the polynomial 348.

The method 700 further includes modifying a configuration of the root detection circuit based on a PDR scheme in response to detection of a root of multiple roots of the polynomial, at 704. For example, a set of multipliers of the multiple sets of multipliers 368 may be deactivated (e.g., powered down) in response to detection of a root of the polynomial 348. As an illustrative example, the set of multipliers may correspond to the first set of multipliers 364 or the second set of multipliers 368.

Figure 8:
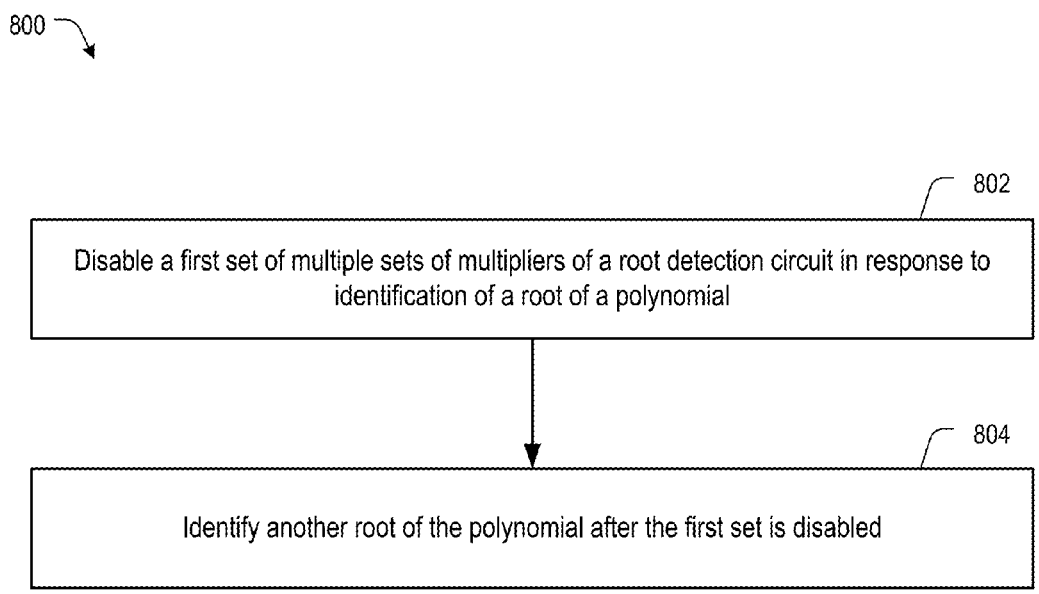
FIG. 8 is a flow diagram of another illustrative embodiment of a method of operation of a device.

Referring to FIG. 8, an illustrative example of a method is depicted and generally designated 800. The method 800 may be performed in a device (e.g., the data storage device 302) that includes a controller (e.g., the controller 330). The controller includes a root detection circuit (e.g., the root detection circuit 354) having multiple sets of multipliers (e.g., the multiple sets of multipliers 368).

The method 800 includes disabling a first set (e.g., the first set of multipliers 364) of the multiple sets of multipliers in response to identification of a root of a polynomial (e.g., the polynomial 348), at 802. To illustrate, the first set of multipliers 364 or the second set of multipliers 366 may be powered down in response to identification of a first root of the polynomial 348 by the root detection circuit 354.

The method 800 further includes identifying another root of the polynomial after the first set is disabled, at 804. For example, the root detection circuit 354 may identify a second root of the polynomial 348 while the first set of multipliers 364 or the second set of multipliers 366 is powered down.

Although the PDR-based partial-parallel Chien search circuit 134 and certain other components described herein are illustrated as block components and described in general terms, such components may include one or more microprocessors, state machines, and/or other circuits configured to enable the data storage device 302 (or one or more components thereof) to perform operations described herein. Components described herein may be operationally coupled to one another using one or more nodes, one or more buses (e.g., data buses and/or control buses), one or more other structures, or a combination thereof. One or more components described herein may include one or more physical components, such as hardware controllers, state machines, logic circuits, one or more other structures, or a combination thereof, to enable the data storage device 302 to perform one or more operations described herein.

Alternatively or in addition, one or more aspects of the data storage device 302 may be implemented using a microprocessor or microcontroller programmed (e.g., by executing instructions) to perform operations described herein, such as one or more operations of the method 700 and/or one or more operations of the method 800. In a particular embodiment, the data storage device 302 includes a processor executing instructions (e.g., firmware) retrieved from the memory 304. Alternatively or in addition, instructions that are executed by the processor may be retrieved from a separate memory location that is not part of the memory 304, such as at a read-only memory (ROM).

The data storage device 302 may be coupled to, attached to, or embedded within one or more accessing devices, such as within a housing of the accessing device 370. For example, the data storage device 302 may be embedded within the accessing device 370 in accordance with a Joint Electron Devices Engineering Council (JEDEC) Solid State Technology Association Universal Flash Storage (UFS) configuration. To further illustrate, the data storage device 302 may be integrated within an electronic device (e.g., the accessing device 370), such as a mobile telephone, a computer (e.g., a laptop, a tablet, or a notebook computer), a music player, a video player, a gaming device or console, an electronic book reader, a personal digital assistant (PDA), a portable navigation device, or other device that uses internal non-volatile memory.

In one or more other implementations, the data storage device 302 may be implemented in a portable device configured to be selectively coupled to one or more external devices, such as a host device. For example, the data storage device 302 may be removable from the accessing device 370 (i.e., "removably" coupled to the accessing device 370). As an example, the data storage device 302 may be removably coupled to the accessing device 370 in accordance with a removable universal serial bus (USB) configuration.

The accessing device 370 may correspond to a mobile telephone, a computer (e.g., a laptop, a tablet, or a notebook computer), a music player, a video player, a gaming device or console, an electronic book reader, a personal digital assistant (PDA), a portable navigation device, another electronic device, or a combination thereof. The accessing device 370 may communicate via a controller, which may enable the accessing device 370 to communicate with the data storage device 302. The accessing device 370 may operate in compliance with a JEDEC Solid State Technology Association industry specification, such as an embedded MultiMedia Card (eMMC) specification or a Universal Flash Storage (UFS) Host Controller Interface specification. The accessing device 370 may operate in compliance with one or more other specifications, such as a Secure Digital (SD) Host Controller specification as an illustrative example. Alternatively, the accessing device 370 may communicate with the data storage device 302 in accordance with another communication protocol. In some implementations, the system 300, the data storage device 302, or the memory 304 may be integrated within a network-accessible data storage system, such as an enterprise data system, an NAS system, or a cloud data storage system, as illustrative examples.

In some implementations, the data storage device 302 may include a solid state drive (SSD). The data storage device 302 may function as an embedded storage drive (e.g., an embedded SSD drive of a mobile device), an enterprise storage drive (ESD), a cloud storage device, a network-attached storage (NAS) device, or a client storage device, as illustrative, non-limiting examples. In some implementations, the data storage device 302 may be coupled to the accessing device 370 via a network. For example, the network may include a data center storage system network, an enterprise storage system network, a storage area network, a cloud storage network, a local area network (LAN), a wide area network (WAN), the Internet, and/or another network.

To further illustrate, the data storage device 302 may be configured to be coupled to the accessing device 370 as embedded memory, such as in connection with an embedded MultiMedia Card (eMMC®) (trademark of JEDEC Solid State Technology Association, Arlington, Va.) configuration, as an illustrative example. The data storage device 302 may correspond to an eMMC device. As another example, the data storage device 302 may correspond to a memory card, such as a Secure Digital (SD®) card, a microSD® card, a miniSD™ card (trademarks of SD-3C LLC, Wilmington, Del.), a MultiMediaCard™ (MMC™) card (trademark of JEDEC Solid State Technology Association, Arlington, Va.), or a CompactFlash® (CF) card (trademark of SanDisk Corporation, Milpitas, Calif.). The data storage device 302 may operate in compliance with a JEDEC industry specification. For example, the data storage device 302 may operate in compliance with a JEDEC eMMC specification, a JEDEC Universal Flash Storage (UFS) specification, one or more other specifications, or a combination thereof.

The memory 304 may include a three-dimensional (3D) memory, such as a resistive random access memory (ReRAM), a flash memory (e.g., a NAND memory, a NOR memory, a single-level cell (SLC) flash memory, a multi-level cell (MLC) flash memory, a divided bit-line NOR (DINOR) memory, an AND memory, a high capacitive coupling ratio (HiCR) device, an asymmetrical contactless transistor (ACT) device, or another flash memory), an erasable programmable read-only memory (EPROM), an electrically-erasable programmable read-only memory (EEPROM), a read-only memory (ROM), a one-time programmable memory (OTP), or a combination thereof. Alternatively or in addition, the memory 304 may include another type of memory. In a particular embodiment, the data storage device 302 is indirectly coupled to an accessing device (e.g., the accessing device 370) via a network. For example, the data storage device 302 may be a network-attached storage (NAS) device or a component (e.g., a solid-state drive (SSD) component) of a data center storage system, an enterprise storage system, or a storage area network. The memory 304 may include a semiconductor memory device.

Semiconductor memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse, phase change material, etc., and optionally a steering element, such as a diode, etc. Further by way of non-limiting example, active semiconductor memory elements include EEPROM and flash memory device elements, which in some embodiments include elements containing a charge region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are exemplary, and memory elements may be otherwise configured.

The semiconductor memory elements located within and/or over a substrate may be arranged in two or three dimensions, such as a two dimensional memory structure or a three dimensional memory structure. In a two dimensional memory structure, the semiconductor memory elements are arranged in a single plane or a single memory device level. Typically, in a two dimensional memory structure, memory elements are arranged in a plane (e.g., in an x-z direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A three dimensional memory array is arranged so that memory elements occupy multiple planes or multiple memory device levels, thereby forming a structure in three dimensions (i.e., in the x, y and z directions, where the y direction is substantially perpendicular and the x and z directions are substantially parallel to the major surface of the substrate). As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in the y direction) with each column having multiple memory elements in each column. The columns may be arranged in a two dimensional configuration, e.g., in an x-z plane, resulting in a three dimensional arrangement of memory elements with elements on multiple vertically stacked memory planes. Other configurations of memory elements in three dimensions can also constitute a three dimensional memory array.

By way of non-limiting example, in a three dimensional NAND memory array, the memory elements may be coupled together to form a NAND string within a single horizontal (e.g., x-z) memory device levels. Alternatively, the memory elements may be coupled together to form a vertical NAND string that traverses across multiple horizontal memory device levels. Other three dimensional configurations can be envisioned wherein some NAND strings contain memory elements in a single memory level while other strings contain memory elements which span through multiple memory levels. Three dimensional memory arrays may also be designed in a NOR configuration and in a ReRAM configuration.

Typically, in a monolithic three dimensional memory array, one or more memory device levels are formed above a single substrate. Optionally, the monolithic three dimensional memory array may also have one or more memory layers at least partially within the single substrate. As a non-limiting example, the substrate may include a semiconductor such as silicon. In a monolithic three dimensional array, the layers constituting each memory device level of the array are typically formed on the layers of the underlying memory device levels of the array. However, layers of adjacent memory device levels of a monolithic three dimensional memory array may be shared or have intervening layers between memory device levels.

Alternatively, two dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three dimensional memory arrays. Further, multiple two dimensional memory arrays or three dimensional memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

One of skill in the art will recognize that this disclosure is not limited to the two dimensional and three dimensional exemplary structures described but cover all relevant memory structures within the spirit and scope of the disclosure as described herein and as understood by one of skill in the art. The illustrations of the embodiments described herein are intended to provide a general understanding of the various embodiments. Other embodiments may be utilized and derived from the disclosure, such that structural and logical substitutions and changes may be made without departing from the scope of the disclosure. This disclosure is intended to cover any and all subsequent adaptations or variations of various embodiments. Those of skill in the art will recognize that such modifications are within the scope of the present disclosure.

The above-disclosed subject matter is to be considered illustrative, and not restrictive, and the appended claims are intended to cover all such modifications, enhancements, and other embodiments, that fall within the scope of the present disclosure. Thus, to the maximum extent allowed by law, the scope of the present invention is to be determined by the broadest permissible interpretation of the following claims and their equivalents, and shall not be restricted or limited by the foregoing detailed description.

What is claimed is:

1. A method comprising:
    in a device including a controller, the controller including a root detection circuit having multiple sets of multipliers, performing:
        configuring the root detection circuit according to a degree of a polynomial; and
        in response to detection of a root of multiple roots of the polynomial, modifying a configuration of the root detection circuit based on a polynomial degree reduction (PDR) scheme.

2. The method of claim 1, wherein configuring the root detection circuit comprises activating one or more sets of the multiple sets of multipliers, and wherein a number of the one or more sets that is activated is associated with a value of the degree of the polynomial.

3. The method of claim 1, wherein, in response to the detection of the root, a set of the multiple sets of multipliers is deactivated in accordance with the polynomial degree reduction (PDR) scheme.

4. The method of claim 1, wherein the root detection circuit is a partial-parallel Chien search circuit.

5. The method of claim 1, further comprising, after detection of the root, generating one or more feedback values at a polynomial reduction circuit and providing the generated one or more feedback values to at least one set of the multiple sets of multipliers.

6. The method of claim 5, further comprising, in response to the detection of the root, selecting one or more multiplier output values to be used by the polynomial reduction circuit to generate the one or more feedback values, wherein the one or more multiplier output values includes a single multiplier output from each of one or more sets of the multiple sets of multipliers.

7. The method of claim 1, wherein the polynomial comprises an error locator polynomial, and wherein each root of the multiple roots corresponds to an error location associated with data received at the controller.

8. The method of claim 1, wherein a first amount of power consumed by the root detection circuit during a first processing iteration of the root detection circuit configured according to a first degree of the polynomial is more than a second amount of power consumed by the root detection circuit during a second processing iteration of the root detection circuit configured according to a second degree of the polynomial, and wherein the second degree is a lower degree as compared to the first degree.

9. The method of claim 8, wherein the root detection circuit is included in a decoder, and wherein the decoder comprises a Bose-Chaudhuri-Hocquenghem (BCH) decoder or a Reed-Solomon decoder.

10. A method comprising:
in a device including a controller, the controller including a root detection circuit having multiple sets of multipliers, performing:
disabling a first set of the multiple sets of multipliers in response to identification of a root of a polynomial; and
identifying another root of the polynomial after the first set is disabled.

11. The method of claim 10, wherein disabling the first set includes powering off multipliers of the first set.

12. The method of claim 10, further comprising, in response to determining that the root and the another root are the same root, generating an indication that data received at the controller is not decodable.

13. The method of claim 10, further comprising, in response to the root being identified, generating one or more feedback values to be provided to at least one set of the multiple sets of multipliers.

14. The method of claim 13, wherein generating the one or more feedback values includes combining outputs of multipliers included in the multiple sets of multipliers.

15. A device comprising:
a first set of multipliers configured to be disabled in response to identification of a root of a polynomial, the first set included in a root detection circuit; and
a second set of multipliers configured to be disabled in response to identification of another root of the polynomial, the second set included in the root detection circuit.

16. The device of claim 15, wherein the polynomial comprises an error locator polynomial, and wherein the root detection circuit comprises multiple inputs configured to receive a set of values that are associated with each coefficient of the error locator polynomial.

17. The device of claim 15, further comprising a decoder that includes the root detection circuit.

18. The device of claim 17, wherein the decoder comprises a Bose-Chaudhuri-Hocquenghem (BCH) decoder or a Reed-Solomon decoder.

19. The device of claim 17, wherein the decoder is configured to use the root detection circuit during a decode operation to identify one or more error locations associated with data received at the decoder.

20. The device of claim 15, further comprising a memory, wherein the memory comprises a flash memory.

21. The device of claim 15, further comprising a memory, wherein the memory includes a three-dimensional (3D) memory configuration that is monolithically formed in one or more physical levels of arrays of storage elements, the one or more physical levels of arrays of storage elements having an active area disposed above a silicon substrate, and further comprising circuitry associated with operation of the storage elements.

22. A root detection circuit comprising:
means for receiving a plurality of coefficients associated with a polynomial;
means for performing multiplication operations using the plurality of coefficients; and
means for generating one or more feedback values to be provided to the means for performing multiplication operations in response to detection of a root of the polynomial.

23. The root detection circuit of claim 22, further comprising means for selectively activating the means for generating one or more feedback values in response to detection of the root.

24. The root detection circuit of claim 23, wherein the means for selectively activating is configured to select one or more multiplier output values of the means for performing multiplication operations to be used by the means for generating one or more feedback values to generate the one or more feedback values.

* * * * *